(12) United States Patent
Omstead et al.

(10) Patent No.: US 9,929,015 B2
(45) Date of Patent: Mar. 27, 2018

(54) HIGH EFFICIENCY APPARATUS AND METHOD FOR DEPOSITING A LAYER ON A THREE DIMENSIONAL STRUCTURE

(71) Applicant: Varian Semiconductor Equipment Associates, Inc., Gloucester, MA (US)

(72) Inventors: Thomas R. Omstead, Gloucester, MA (US); Simon Ruffell, South Hamilton, MA (US); Tristan Ma, Lexington, MA (US); Ethan A. Wright, Ipswich, MA (US); John Hautala, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 366 days.

(21) Appl. No.: 14/336,886

(22) Filed: Jul. 21, 2014

(65) Prior Publication Data

US 2016/0005594 A1    Jan. 7, 2016

Related U.S. Application Data

(63) Continuation of application No. 14/324,907, filed on Jul. 7, 2014.
(Continued)

(51) Int. Cl.
*H01L 21/02* (2006.01)
*H01L 21/225* (2006.01)
(Continued)

(52) U.S. Cl.
CPC .... *H01L 21/2253* (2013.01); *C23C 16/45536* (2013.01); *C23C 16/45551* (2013.01);
(Continued)

(58) Field of Classification Search
USPC .................................................. 250/492.3
See application file for complete search history.

(56) References Cited

U.S. PATENT DOCUMENTS 5,693,179 A * 12/1997 Blackburn ........ H01J 37/32449
                                                204/192.32
6,387,207 B1    5/2002 Janakiraman et al.
(Continued)

FOREIGN PATENT DOCUMENTS

JP    2012097624 A    5/2012
KR   1020070024965 A    3/2007

OTHER PUBLICATIONS

International Search Report and Written Opinion dated Oct. 30, 2015, in corresponding International Patent Application No. PCT/US2015/039345.

*Primary Examiner* — Phillip A Johnston

(57) ABSTRACT

In one embodiment, a processing apparatus may include a process chamber configured to house a substrate and a hybrid source assembly that includes a gas channel coupled to a molecular source; and a plasma chamber configured to generate a plasma and isolated from the gas channel. The processing apparatus may also include an extraction assembly disposed between the hybrid source assembly and process chamber, coupled to the gas channel and plasma chamber, and configured to direct an ion beam to a substrate, the ion beam comprising angled ions wherein the angled ions form a non-zero angle with respect to a perpendicular to a substrate plane; and configured to direct a molecular beam comprising molecular species received from the gas channel to the substrate.

15 Claims, 10 Drawing Sheets

Related U.S. Application Data

(60) Provisional application No. 62/021,491, filed on Jul. 7, 2014.

(51) Int. Cl.

| | | |
|---|---|---|
| *C23C 16/455* | (2006.01) | |
| *C23C 16/48* | (2006.01) | |
| *C23C 16/50* | (2006.01) | |
| *C23C 16/52* | (2006.01) | |
| *H01J 37/32* | (2006.01) | |
| *H01L 21/311* | (2006.01) | |
| *H01L 21/324* | (2006.01) | |
| *H01L 29/66* | (2006.01) | |
| *H01L 21/22* | (2006.01) | |

(52) U.S. Cl.
CPC ............ *C23C 16/486* (2013.01); *C23C 16/50* (2013.01); *C23C 16/52* (2013.01); *H01J 37/32357* (2013.01); *H01L 21/0217* (2013.01); *H01L 21/0226* (2013.01); *H01L 21/0228* (2013.01); *H01L 21/02057* (2013.01); *H01L 21/02112* (2013.01); *H01L 21/02164* (2013.01); *H01L 21/02167* (2013.01); *H01L 21/02211* (2013.01); *H01L 21/02219* (2013.01); *H01L 21/02274* (2013.01); *H01L 21/02636* (2013.01); *H01L 21/225* (2013.01); *H01L 21/2252* (2013.01); *H01L 21/31116* (2013.01); *H01L 21/324* (2013.01); *H01L 29/66803* (2013.01); *H01L 21/2225* (2013.01)

(56) References Cited

U.S. PATENT DOCUMENTS

| | | | |
|---|---|---|---|
| 7,297,581 | B1 | 11/2007 | Hill et al. |
| 8,637,411 | B2 | 1/2014 | Swaminathan et al. |
| 8,674,607 | B2 * | 3/2014 | Iizuka .................. H01J 37/321 |
| | | | 118/715 |
| 2002/0046705 | A1 | 4/2002 | Sandhu et al. |
| 2003/0155079 | A1 * | 8/2003 | Bailey, III ........ H01J 37/32449 |
| | | | 156/345.49 |
| 2004/0033679 | A1 | 2/2004 | Jacobson et al. |
| 2004/0187784 | A1 | 9/2004 | Sferlazzo |
| 2006/0068104 | A1 | 3/2006 | Ishizaka et al. |
| 2006/0208202 | A1 | 9/2006 | Gupta et al. |
| 2007/0000444 | A1 | 1/2007 | Shimizu |
| 2007/0278576 | A1 | 12/2007 | Kim et al. |
| 2008/0026162 | A1 | 1/2008 | Dickey et al. |
| 2009/0294800 | A1 | 12/2009 | Cheng et al. |
| 2010/0126964 | A1 | 5/2010 | Smith et al. |
| 2011/0084215 | A1 | 4/2011 | Hautala et al. |
| 2012/0207944 | A1 | 8/2012 | Finch et al. |
| 2012/0222616 | A1 | 9/2012 | Han et al. |
| 2012/0248328 | A1 | 10/2012 | Renau et al. |
| 2013/0115763 | A1 | 5/2013 | Takamure et al. |
| 2013/0196078 | A1 | 8/2013 | Yudovsky et al. |
| 2013/0210238 | A1 | 8/2013 | Yudovsky |
| 2013/0270655 | A1 | 10/2013 | Adam et al. |
| 2013/0280876 | A1 | 10/2013 | Tsai et al. |
| 2014/0004689 | A1 | 1/2014 | Nainani et al. |
| 2014/0159159 | A1 | 6/2014 | Steigerwald et al. |
| 2015/0087140 | A1 | 3/2015 | Nozawa et al. |

* cited by examiner

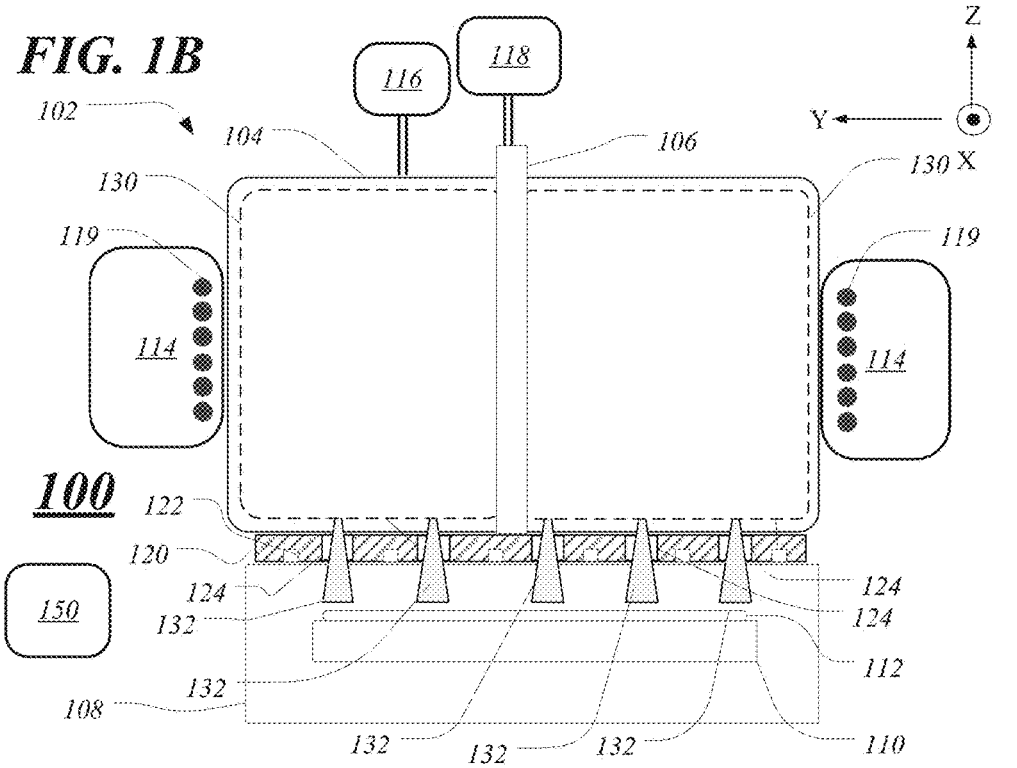
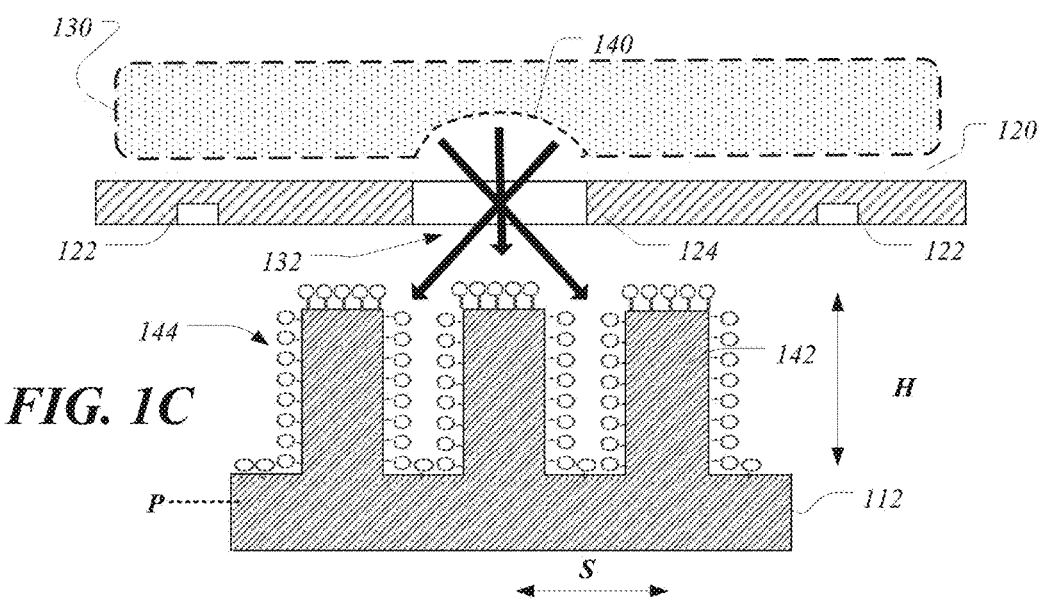

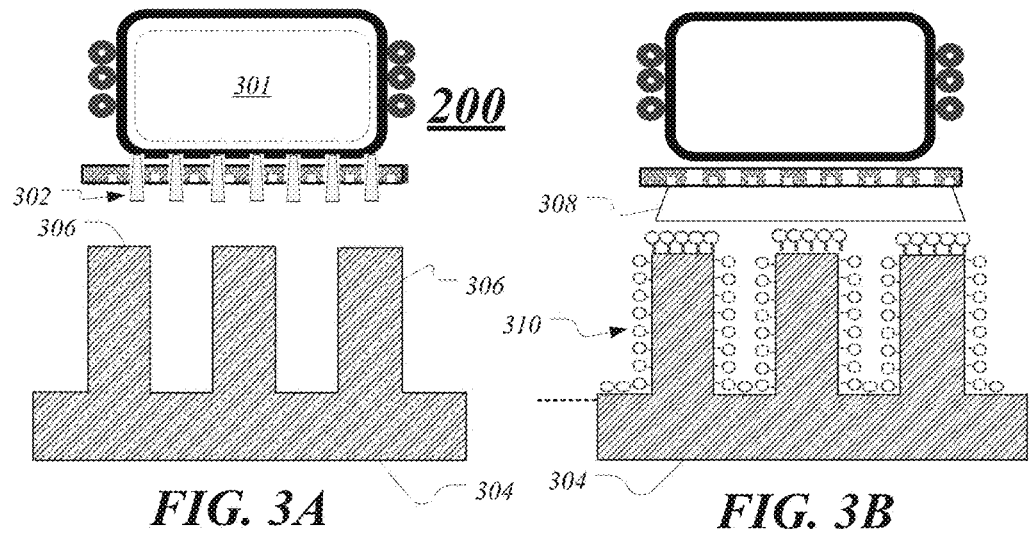
FIG. 3A    FIG. 3B
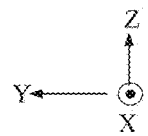
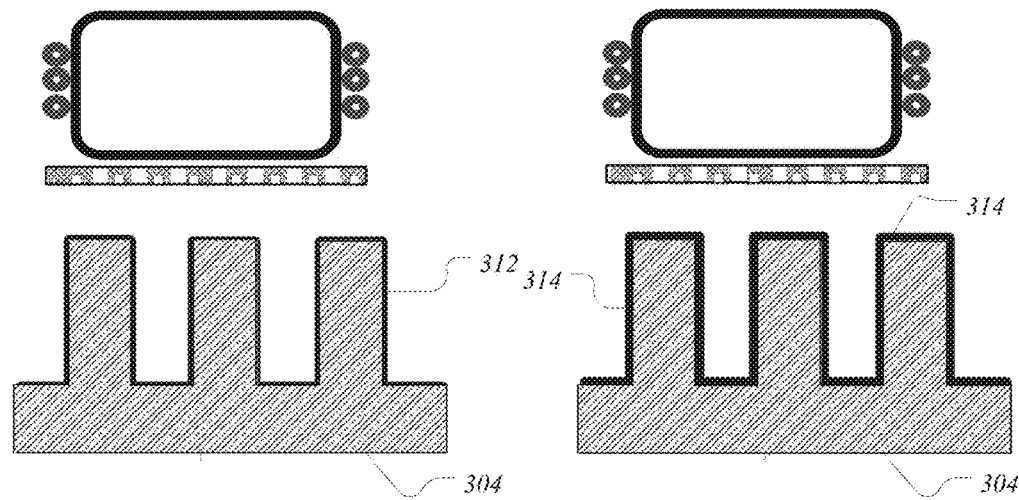
FIG. 3C    FIG. 3D

HIGH EFFICIENCY APPARATUS AND METHOD FOR DEPOSITING A LAYER ON A THREE DIMENSIONAL STRUCTURE

RELATED APPLICATIONS

This application claims priority to U.S. provisional Patent application No. 62/021,491, filed Jul. 7, 2014, and further claims priority to U.S. patent application Ser. No. 14/324,907, filed Jul. 7, 2014.

FIELD

The present embodiments relate to substrate processing, and more particularly, to processing apparatus and methods for depositing layers by atomic beam or molecular beam deposition.

BACKGROUND

Many devices including electronic transistors may have three dimensional shapes that are difficult to process using conventional techniques. The topology of such devices may be up-side down, re-entrant, over-hanging, or vertical with respect to a substrate plane of a substrate in which such devices are formed. In order to process such devices such as to grow layers on such topology, improved techniques may be useful that overcome limitations of conventional processing. For example, doping of substrates is often performed by ion implantation in which substrate surfaces that may be effectively exposed to dopant ions are limited by line-of-sight trajectories of the ions. Accordingly, vertical surfaces, re-entrant surfaces, or over-hanging surfaces may be inaccessible to such dopant ions. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment a processing apparatus may include a process chamber configured to house a substrate and a hybrid source assembly that includes a gas channel coupled to a molecular source; and a plasma chamber configured to generate a plasma and isolated from the gas channel. The processing apparatus may also include an extraction assembly disposed between the hybrid source assembly and process chamber, coupled to the gas channel and plasma chamber, and configured to direct an ion beam to a substrate, the ion beam comprising angled ions wherein the angled ions form a non-zero angle with respect to a perpendicular to a substrate plane; and direct a molecular beam comprising molecular species received from the gas channel to the substrate.

In another embodiment, a processing system may include a process chamber configured to house a substrate and a hybrid source assembly that includes a plasma chamber configured to generate a plasma and a gas channel extending through the plasma chamber and isolated from the plasma chamber. The processing apparatus may also include an extraction assembly disposed between the hybrid source assembly and process chamber, coupled to the gas channel and plasma chamber, and configured to direct an ion beam to a substrate, the ion beam comprising angled ions wherein the angled ions form a non-zero angle with respect to a perpendicular to a substrate plane; and to direct a molecular beam comprising molecular species received from the gas channel to the substrate.

In a further embodiment a method may include providing a substrate having a surface that defines a substrate plane and a substrate feature that extends from the substrate plane; directing at least one ion beam through an extraction assembly adjacent the substrate, where the at least one ion beam comprises angled ions that are incident on the substrate at a non-zero angle with respect to a perpendicular to the substrate plane, where the at least one ion beam is effective to form a first sub-monolayer comprising a first species; and directing a molecular beam to the substrate through the extraction assembly, where the molecular beam is effective to form a second sub-monolayer of a second species that is configured to react with the first sub-monolayer of the first species to form a monolayer of a product material.

BRIEF DESCRIPTION OF THE DRAWINGS

FIG. 1B depicts operation of the processing apparatus of FIG. 1A in one mode for delivering ion beams to a substrate;

FIG. 1C depicts a close-up of a portion of the extraction assembly according to the scenario of FIG. 1B;

FIG. 3A to FIG. 3H depict an embodiment of the disclosure that details exemplary operations involved in a method for forming a multi-layer stack on three dimensional features using monolayer-by-monolayer growth.

DETAILED DESCRIPTION

Figure 1A:
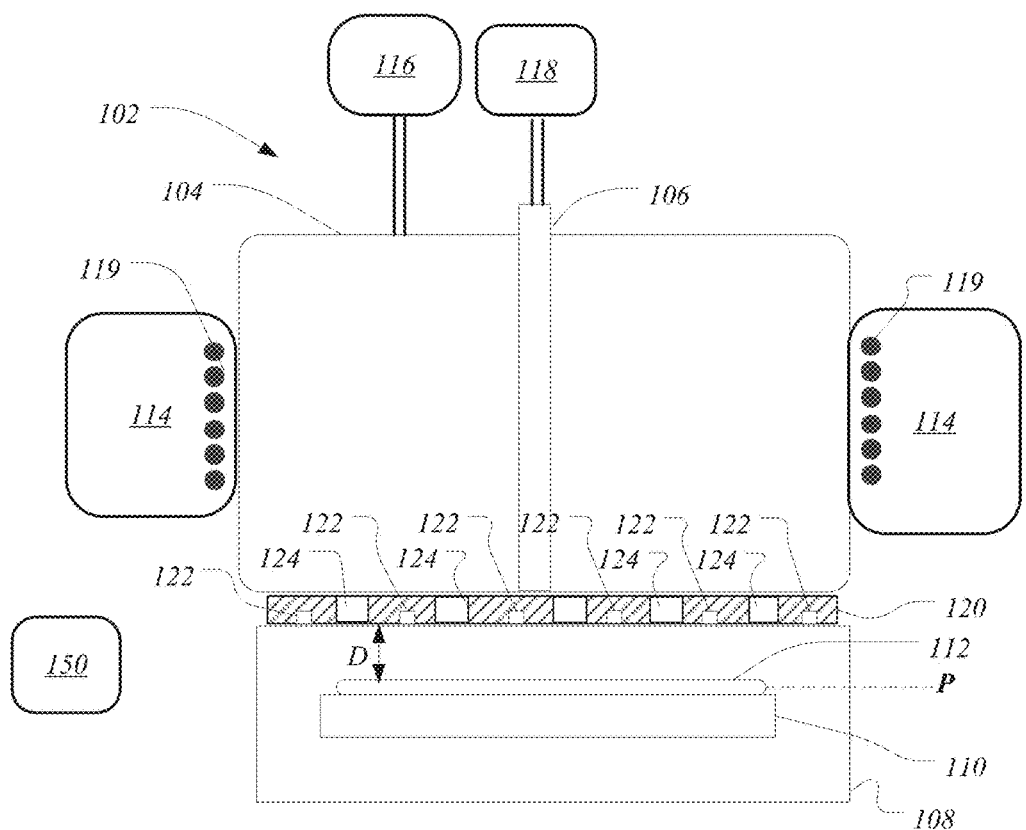
FIG. 1A depicts a processing apparatus according to embodiments of the present disclosure.
Figure 1A:
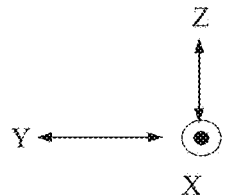

The present embodiments are related to techniques for processing a substrate including forming thin layers on substrate features of a substrate. The substrate features of the substrate may extend from a substrate plane, and may form such structures as three dimensional lines, fins, pads, pillars, walls, trenches, holes, domes, bridges, cantilevers, other suspended structures, and the like. The embodiments are not limited in this context. Moreover, these features may be collectively or individually referred to herein as a "three dimensional" feature or features. A thin layer that is formed on a substrate feature may be a layer provided for doping, insulation, for encapsulation, or for other purpose.

In various embodiments, a thin layer may be formed by a modified atomic layer deposition or by modified molecular layer deposition process. These techniques may share characteristics common to conventional atomic layer deposition (ALD) or conventional molecular layer deposition (MLD) except where otherwise noted. The present embodiments provide novel improvements over conventional ALD and MLD that facilitate formation on three dimensional substrate features in which surface topography may be severe, such as that described above. In some embodiments novel hybrid processing apparatus and methods provide advantages over conventional ALD and chemical vapor deposition (CVD).

In some embodiments, processes that involve formation of a doping layer using ALD or MLD, may include a series of operations that form multiple layers on substrates that may include three dimensional features. In addition, the formation of each layer may involve multiple operations such as those characteristic of an ALD or MLD process. In one implementation for doping a substrate using a deposited layer formed by ALD or MLD, a surface of the substrate feature may first be cleaned to remove native oxide, which may involve providing a plasma using such species as hydrogen, oxygen, and/or ammonia radicals and molecular hydrides such nitrogen triflouride, arsine, and phosphine.

Secondly, a conformal plasma enhanced atomic layer deposition of dopant oxides may be performed to form a dopant oxide layer on a substrate feature. This ALD process may involve deposition of species that include arsenic, boron, phosphorus, arsenic oxide, phosphorus oxide, boron oxides and/or doped silicon oxides such as silicon arsenic oxide, silicon phosphorus oxide, and silicon boron oxides. In particular, these oxides may be deposited using molecular precursors such as arsine, phosphine, and diborane together with plasma-generated atomic beams that contain hydrogen, oxygen, nitrogen, and/or ammonia.

In a subsequent operation, a sealing or encapsulating layer such as silicon nitride may be deposited using a combination of a molecular beam containing silane, for example, and another beam containing nitrogen, hydrogen, and/or ammonia. Once the native oxide is removed from a substrate feature to be doped and the dual layer of dopant oxide and sealing nitride is deposited dopants from the dopant oxide layer may be driven into the substrate feature using a known technique such as rapid thermal annealing.

In various embodiments of the disclosure, a layer or plurality of layers may be formed using a combination of angled ions and molecular beams, where the molecular beams may comprise undissociated molecules in some implementations. The directing of angled ions may be used in conjunction with other operations to create novel ALD or MLD processes that grow a layer or plurality of layers on a three dimensional substrate feature without the use of a mask. As used herein, unless otherwise noted or qualified by the context, the term "layer" may refer to a sub-monolayer, a monolayer of a material, or may refer to a thin coating or film that has the thickness of many monolayers. Thus, in some instances, a grown "layer" may be composed of a single monolayer that is formed over target portions of a substrate or may be composed of multiple monolayers. Moreover, consistent with various embodiments of the disclosure, a layer that has the thickness of many monolayers may be formed in a monolayer-by-monolayer fashion as in conventional ALD or MLD processes. However, the present embodiments also cover selective growth of layers having the thickness of multiple monolayers in which a layer is not grown in a monolayer-by-monolayer fashion.

Moreover the present embodiments provide apparatus in which a layer may be grown on a substrate in a monolayer-by-monolayer fashion without the need of transporting the substrate between different chambers to receive different species that may form the constituents of an ALD or MLD growth process.

Formation of a layer comprising a product material by an ALD or MLD process may involve deposition of one monolayer at a time of the product material. Each monolayer of the product material may include two or more different elements that together form a compound material, an alloy, or other multielement material such as silicon oxide, silicon nitride, doped oxides, or other material. The formation of a given monolayer may be accomplished by deposition of a sub-monolayer of a first species or component followed by providing a second sub-monolayer of a second species that reacts with the first sub-monolayer to form a monolayer of the compound. Thus, as used herein the term "sub-monolayer" may denote a layer of a first element that may react with a layer of a second element to form a monolayer of the compound. For example, during deposition of a binary compound such as silicon oxide the layer to be formed is deposited by the repetition of two different half-cycles. After each half-cycle, a fixed amount of reactive species supplied by a first precursor remains on the substrate surface. Ideally, though not necessarily, a single monolayer of a first species may be produced after a first half cycle. In the present context, this single monolayer of a first species of a compound to be formed is referred to as a "sub-monolayer" because the full monolayer of the compound requires the addition of second species to react with the first species. Thus, atoms of the sub-monolayer of first species may be reacted with atoms or molecules of the second species supplied in the next half cycle. In each half-cycle, subsequent to supplying a given species, a purge can be performed to remove any unreacted species of the depositing material. The total amount of material reacted in a cycle may thus be equivalent to a sub-monolayer of each of the first species or second species.

In conventional ALD or MLD processes, a first chamber may be configured to provide a first species that forms a first sub-monolayer, while a second chamber may be configured to provide a sub-monolayer of a second species to react to form a full monolayer of a desired material. This conventional ALD or MLD process may entail moving a substrate back and forth between positions that are used to receive material from the first chamber and second chamber. Accordingly, this process may be relatively slow.

Various embodiments of the present disclosure provide novel apparatus that are effective to fabricate layers, films or coatings in a monolayer-by-monolayer fashion, including on three dimensional structures, without the need for substrate movement. In addition to increasing substrate throughput, this may reduce footprint of apparatus for fabricating devices by reducing the number of chambers required.

Additional embodiments of the disclosure provide novel processing in which ion beams and molecular beams may be provided simultaneously to a substrate to grow conformal films over three dimensional substrates at a rapid rate consistent with conventional CVD processes.

FIG. 1A depicts a processing apparatus 100 arranged according to various embodiments of the disclosure. The processing apparatus 100 may be employed in particular to grow a layer on a three dimensional structure. The processing apparatus 100 includes a hybrid source assembly 102 that is adjacent to a process chamber 108. The hybrid source assembly includes a plasma chamber 104 that may be used to generate angled ions to be provided to a substrate 112, which is held or supported by the substrate holder 110 disposed in the process chamber 108, and a process chamber 104 adjacent the source assembly. The use of angled ions is discussed in more detail below. However, in brief, the term "angled ions" as used herein refers to an assemblage of ions such as ions in an ion beam, at least some of which are characterized by trajectories that have a non-zero angle of incidence with respect to a perpendicular to a plane P of substrate 112, as illustrated in FIG. 1A. For example, with reference to the Cartesian coordinate system shown, angled ions may have trajectories that form a non-zero angle with respect to the Z-axis.

The processing apparatus 100 also includes a plasma source 114, which may include a plasma chamber power supply and applicator 119 or electrode to generate a plasma according to known techniques. For example, the plasma source 114, in various embodiments, may be an in situ source or remote source, an inductively coupled plasma source, capacitively coupled plasma source, helicon source, microwave source, arc source, or any other type of plasma source. The embodiments are not limited in this context. When gas is supplied by gas source 116 to the plasma chamber 104 the plasma source 114 may ignite a plasma that provides angled ions to the substrate 112 as discussed below. In some embodiments, such as an apparatus that uses an inductively coupled source, the angled ions may be formed from molecular species such as oxygen or nitrogen, and may be highly fractionated such that the angled ions are predominantly atomic ions. However, the embodiments are not limited in this context.

As further shown in FIG. 1A, the processing apparatus 100 includes a gas channel 106. The gas channel 106 may transport, for example, molecular gas that is received from a molecular source 118. The molecular source 118 may operate at a relatively higher pressure, such as atmospheric pressure or a pressure of many Torr, as known in the art. The process chamber 108 may operate at a relatively lower pressure, such as several milliTorr or less than 1 milliTorr, as known in the art. As such, the molecular gas may be directed through the process chamber 108 to the substrate 112 as a molecular beam without gas phase collisions in the process chamber 108. The gas channel 106 may provide the molecular gas to the substrate 112 for reaction with species such as angled ions provided by the plasma chamber 104. In some embodiments, and as illustrated in FIG. 1A, the plasma chamber 104 may be disposed around the gas channel 106 such that the gas channel 106 extends through the plasma chamber 104. This allows both angled ions and molecular beams to be delivered to the substrate without movement of the substrate as detailed below. In some embodiments, the gas channel 106 may be a shielded conductive tube that is electrically isolated from the plasma chamber 102. Molecular species that traverse the gas channel 106 may accordingly be shielded from electric fields and may remain unionized and undissociated when entering the process chamber 108.

As further shown in FIG. 1A, the processing apparatus 100 includes an extraction assembly 120 that is disposed between the hybrid source assembly 102 and process chamber 108. The extraction assembly 120 may be disposed along at least a portion of a side of the plasma chamber 104 as shown. In some embodiments, the extraction assembly 120 may be affixed to at least part of the hybrid source assembly 104. For example, the gas channel 106 may be removably or permanently affixed to the extraction assembly 120. The plasma chamber 104 may also be affixed to the extraction assembly in some implementations.

The extraction assembly 120 may include an extraction aperture or a plurality of extraction apertures 124 as shown in FIG. 1A. As detailed below, the extraction apertures 124 are configured to extract angled ions from the plasma chamber 104 to deliver the angled ions to the substrate 112. The extraction assembly 120 also may include a gas aperture or a plurality of gas apertures 122 as shown in FIG. 1A. The gas apertures 122 may be arranged, for example, in a showerhead configuration in which multiple small apertures are distributed over a two dimensional array, which may cover an area in the X-Y plane that is comparable to or larger than an area of the substrate 112.

Figure 1D:
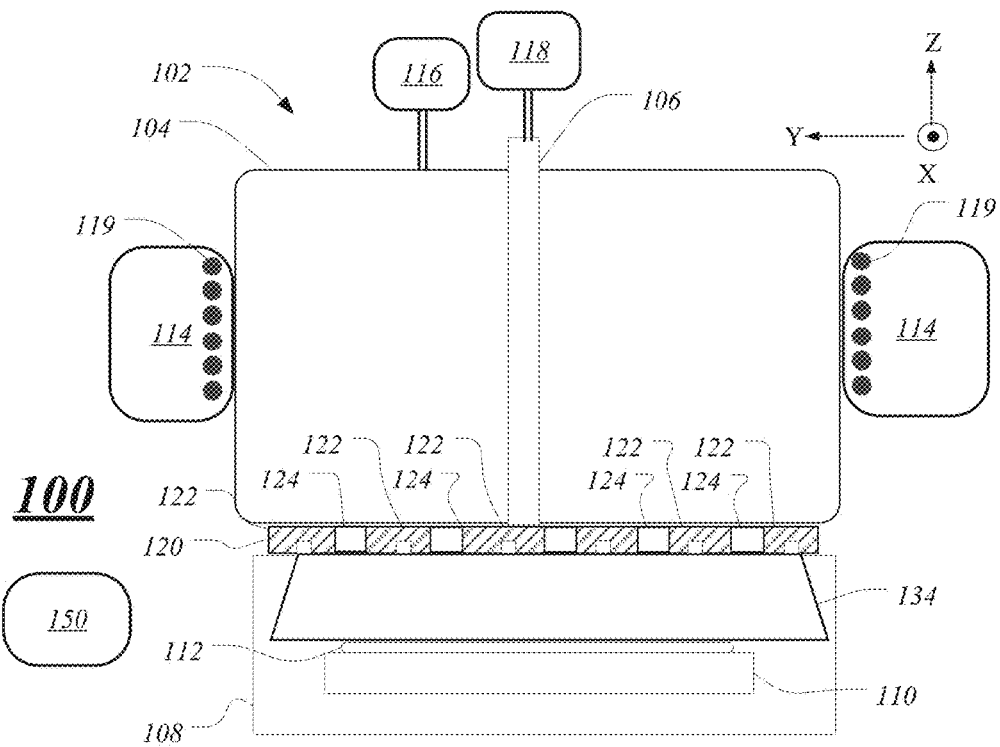
FIG. 1D depicts operation of the processing apparatus of FIG. 1A in another mode for delivering a molecular beam to a substrate.

FIG. 1B and FIG. 1D depict examples of operation of the processing apparatus 100. In particular FIG. 1B depicts an operation of generating angled ions as an ion beam 132 while FIG. 1D depicts generating a molecular beam 134. In various embodiments as detailed below the ion beam 132 and molecular beam 134 may be generated in a sequential or alternating fashion, while in other embodiments the ion beam 132 and molecular beam 134 may be generated concurrently. In some embodiments, the pressure in the process chamber 108 may be maintained at a sufficiently low pressure so that when the molecular beam 134 and ion beam 132 are provided to the substrate 122 gas phase collisions are avoided. For example, at 1 mTorr gas pressure in the process chamber 108 the mean free path may be in the range of 3 cm to 7 cm, such as 5 cm. Thus, the substrate 112 may be maintained at a distance D (see FIG. 1A) of less than 5 cm from the extraction assembly 120 when operating the process chamber 108 at 1 mTorr. This provides the advantage that molecular species of the molecular beam 134, having sustained no collisions, may arrive at the substrate in an undissociated form where their sticking coefficient may be relatively low, such as less than 0.1 in one example. This allows the molecular species to undergo multiple surface collisions with a substrate feature before attaching, which facilitates the ability to reach regions deep within trenches, for example.

Another advantage of a providing a collisionless environment near the substrate 112 is that the angle of incidence of ions extracted from the plasma 130 may be maintained along a desired trajectory. In various embodiments, the sequence of operations shown in FIGS. 1B and 1D may constitute a process cycle that is used to form a layer of a material, such as a monolayer of a nitride or a dopant oxide. The operations depicted in FIG. 1B and FIG. 1D may be performed without movement of a substrate 112, and may be performed in rapid succession, thus facilitating a high throughput process. For example, the extraction assembly 120 may be configured to provide angled ions and a molecular beam that cover the substrate 112 without having to move the substrate. This may be useful for relatively larger substrates such as a wafer having a diameter of 200 mm or greater. In such examples transport of a substrate between different chambers or processing stations to separately receive ions and a molecular beam is avoided. As may be apparent, such substrate transport may entail movement of the substrate 112 over a distance greater than the width or diameter of the substrate along the Y-direction. This in turn, facilitates processing of the substrate 112 in a more compact apparatus than would otherwise be needed.

In one implementation that shares features with ALD processing, the ion beam 132 may be first provided to a substrate, switched off, and then the molecular beam 134 may be provided to the substrate. In another implementation, the ion beam 132 and molecular beam 134 may be provided concurrently to the substrate 112 while the pressure in process chamber 108 is maintained sufficiently low such that gas molecules in the molecular beam 134 do not undergo gas phase collisions. As noted above, this allows the molecules to arrive at the substrate 112 in undissociated form together with ions from the ion beam 132, which may produce a more conformal coating on three dimensional structures.

Turning now to FIG. 1B, in this example, the plasma source 114 has ignited a plasma 130, which may be used to generate angled ions for growing a monolayer on the substrate 112. FIG. 1C depicts a close-up of a portion of the extraction assembly 120 and a portion of the substrate 112 according to the scenario of FIG. 1B. As shown in FIG. 1B, ion beams 132 may be extracted from the plasma 130 through the extraction apertures 124 and directed to the substrate 112. The ion beams 132 may be extracted, for example, when a continuous or pulsed bias voltage is applied between the substrate holder 110 and plasma chamber 104.

As shown in FIG. 1C, the substrate 112 may be provided with three dimensional features such as substrate features 142. Notably, the various components may not be drawn to scale, particularly in the illustration of FIG. 1C. For example, features such as the extraction aperture 124 and gas apertures 122 may have dimensions on the order of millimeters or centimeters, while the substrate features 142 may have dimensions on the order of micrometers or nanometers in some cases. As further shown in FIG. 1C, the extraction aperture 124 may cause the plasma sheath boundary 140 to assume a curved shape adjacent the extraction aperture, which may result in ions of the ion beam 132 exiting the plasma 130 with trajectories that are spread over a range of angles of incidence. The ion beam 132 may in particular include angled ions that are effective to treat the different surfaces of the substrate features 142, including sidewalls of the substrate features 142, which may extend along a perpendicular to the substrate plane P. Such sidewalls may not be effectively treated by ions that are directed along the perpendicular as may be the case in conventional plasma tools such as plasma immersion tools.

It is to be noted that although the ion beam 132 is shown in FIG. 1C as having three trajectories the ion beam may be characterized by an ion angular distribution. The term "ion angular distribution" refers to the mean angle of incidence of ions in an ion beam with respect to a reference direction such as perpendicular to a substrate, as well as to the width of distribution or range of angles of incidence centered on the mean angle, termed "angular spread" for short. In some examples, the ion angular distribution may be a single mode in which the peak in number of ions as a function of incidence angle is centered on a perpendicular to the plane P. In other examples, the ion angular distribution may involve a mean angle that forms a non-zero angle with respect to a perpendicular to the plane P of the substrate 112. In particular examples, the ion angular distribution of ion beam 132 may be a bimodal distribution of angles of incidence. For example, the ion beam 132 may have trajectories where the greatest number of trajectories are centered at two angular modes. In various embodiments, by controlling apparatus settings such as plasma power, plasma chamber pressure, and so forth, the separation between peaks of a bimodal distribution may be varied. For example, the peak angles may set at angles between +/−15 degrees with respect to perpendicular to +/−45 degrees with respect to perpendicular in various embodiments, and in one particular embodiment at +/−30 degrees with respect to perpendicular to the plane P. In some implementations a beam blocker (not shown) may be positioned inside a plasma chamber adjacent an extraction aperture, which may have the effect of creating a pair of angled ion beams that may constitute a bimodal distribution of ions.

In some examples, the ion beam 132 may be composed of reactive ions such as atomic oxygen or atomic nitrogen ions. In other examples, the ion beam 132 may be composed of molecular oxygen ions or molecular nitrogen ions, or may be composed of mixtures of atomic oxygen ions and molecular oxygen ions, or mixtures or molecular nitrogen ions and atomic nitrogen ions. The embodiments are not limited in this context. As shown in FIG. 1C the ion beam 132 may be effective to generate a sub-monolayer 144 that covers the three dimensional surfaces of the substrate 112 including the substrate features 142. The ability to tailor the ion angular distribution of ions provided to a three dimensional substrate feature, facilitates the ability to direct ions to different regions of a three dimensional feature in a manner that generates more conformal coverage of such three dimensional structures. For example, the angle(s) of incidence of ions may be tailored so that sufficient flux of ions reaches the lower surfaces as well as sidewalls of trench structures to form a uniform sub-monolayer, as suggested by the sub-monolayer 144.

For purposes of further illustration it may be assumed that the substrate 112 is silicon and the layer to be grown in the example of FIGS. 1B and 1D is silicon oxide. Accordingly, the sub-monolayer 144 may be composed of oxygen species that adhere to the silicon substrate.

Turning now to FIG. 1D, there is shown an instance in which the processing apparatus 100 provides a molecular beam 134 to the substrate 112. Following the example of FIG. 1B, in one particular instance the molecular beam 134 may comprise molecular species such as unionized and undissociated molecules that are effective to react with species of the sub-monolayer 144 present on the surface of the substrate 112. For example, the molecular beam 134 may comprise silane molecules that are effective to react with an oxide sub-monolayer such as the sub-monolayer 144 shown in FIG. 1C.

Figure 1E:
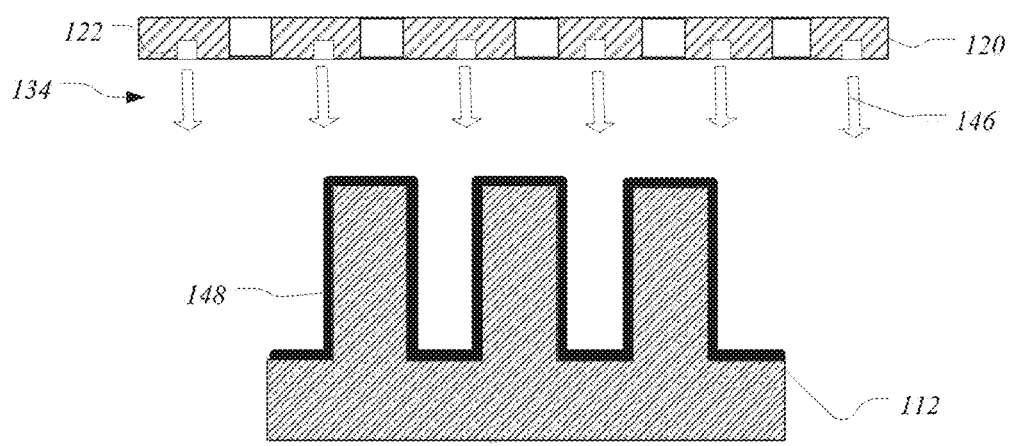
FIG. 1E depicts a close-up of the substrate of FIG. 1D during exposure to the molecular beam.

FIG. 1E depicts a close-up of the substrate 112 during exposure to the molecular beam 134. As illustrated, the molecular beam 134 may be composed of beamlets 146 that stream out of the gas apertures 122. The molecules of the molecular beam 134 may react with the sub-monolayer 144 to form a monolayer 148 as shown, such as silicon oxide.

Although the FIGS. 1B-1E illustrate a sequential process for forming a conformal coating on a three dimensional substrate feature 142, in other embodiments as detailed below a molecular beam may be provided simultaneously with an ion beam in a hybrid process that may provide conformality characteristic of ALD processes with deposition rates characteristic of CVD processes.

Returning again to FIG. 1A, in various embodiments, the gas channel 106 is isolated from the plasma chamber 104 in that gas provided to the gas channel 106 does not mix with gas provided in the plasma chamber 104. For example, molecular gas may be directed through the gas channel 106 into the extraction assembly 120 in enclosures or channels that are isolated from the interior of plasma chamber 104. The molecular gas may then be delivered into the process chamber 108 and substrate 112. In various embodiments, the process chamber 108 may be evacuated by pumping apparatus 150 (see FIG. 1A) that may maintain the pressure in process chamber 108 at a desired vacuum level, such as below several mTorr, and in some cases at a pressure below $10^{-4}$ Torr. In addition, the process chamber 108 may be evacuated in a manner that prevents molecular gas provided through the gas channel 106 from backstreaming into the interior of plasma chamber 108. The low pressure in the process chamber 108 also may prevent gas phase collisions for a molecular gas so that the molecular gas may arrive at the substrate 112 in an undissociated form more conducive for producing a conformal coating on three dimensional substrate features as discussed above. To further prevent the dissociation of the molecular gas, grids may be placed in slots 124 to restrict plasma species from entering the process chamber 108. In this mode the plasma chamber 104 acts as a source of merely ions and radicals. Any plasma formed in the plasma chamber 104 would not extend below the extraction plate 120.

During processing to direct angled ions to the substrate 112 as shown in FIG. 1B, the plasma 130 may form around the gas channel 106 such that the plasma 130 has a donut or annular shape when viewed in the X-Y plane. Ions may then be extracted through the extraction apertures 124 into the process chamber 108 without backstreaming into the gas channel 106 via the gas apertures 122.

In this manner, an atomic layer deposition process may be performed in an efficient manner in which angled ions and molecular gas may be alternately provided to the substrate 112 to deposit a conformal monolayer on a substrate including those substrates having three dimensional substrate features.

Figure 2A:
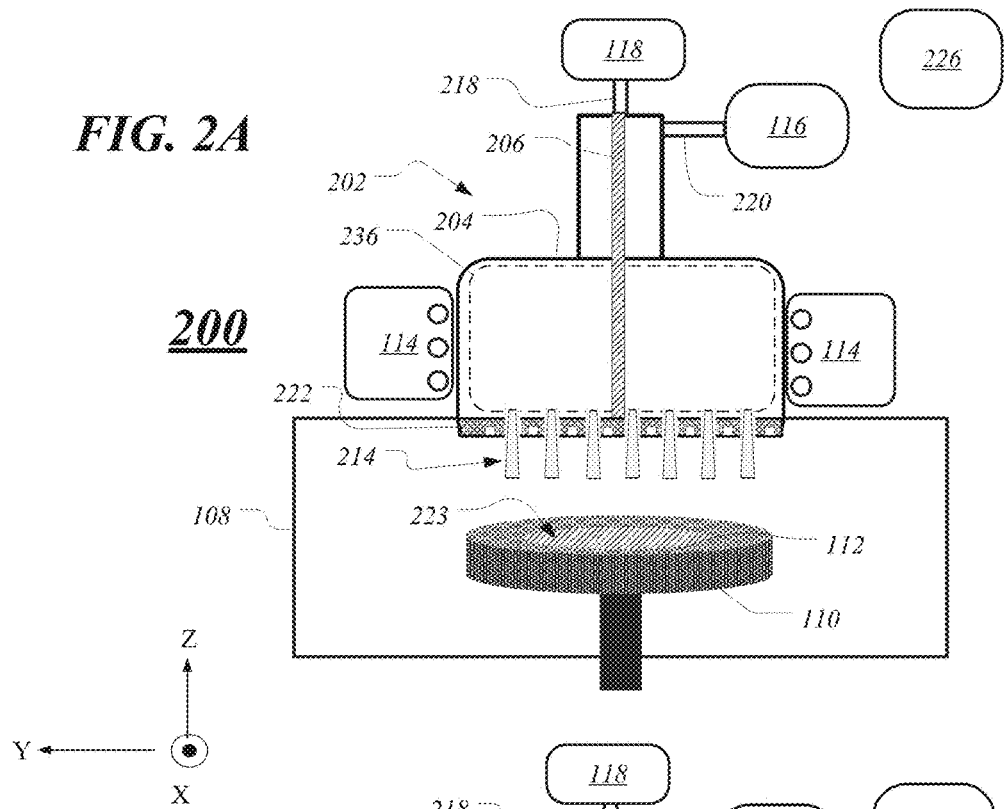
FIG. 2A depicts another processing apparatus according to additional embodiments of the present disclosure, shown in a first operation mode.
Figure 2B:
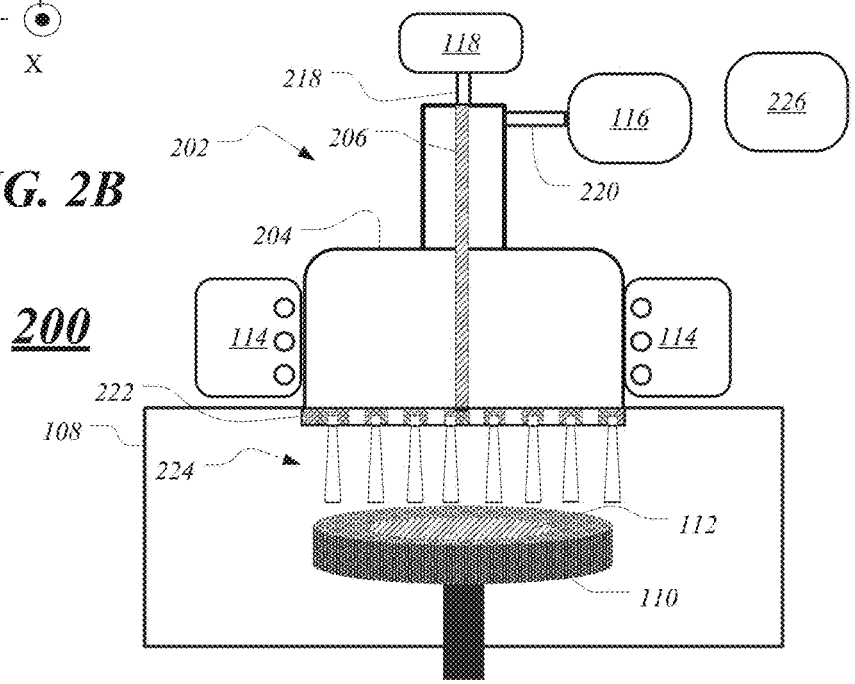
FIG. 2B depicts the processing apparatus of FIG. 2A, shown in a second operation mode.

FIG. 2A and FIG. 2B depict operation of another processing apparatus 200 according to further embodiments of the disclosure. In this instance the processing apparatus 200 may include components of the processing apparatus 100 that are labeled similarly. The processing apparatus 200 includes a hybrid source assembly 202 that includes a plasma chamber 204 and gas channel 206 to deliver angled ions or molecular gas, respectively, to a substrate chamber 210. In particular, the gas channel 206 is coupled to the molecular source 118 via a gas feed 218, while the plasma chamber 204 is coupled to the gas source 116 via the gas feed 220. As also shown in FIG. 2A, the processing apparatus 200 includes a controller 226 coupled to the plasma source 114, gas source 116, and molecular source 118 to coordinate delivery of angled ions and molecular species to the substrate 112. The controller 226 may be embodied in hardware such as logic circuitry, software, or a combination of hardware and software.

As further shown in FIG. 2A and FIG. 2B, the processing apparatus 200 includes an extraction assembly 222 that is configured to deliver angled ions as well as a molecular beam to the substrate 112. Details of one implementation of the extraction assembly 222 are discussed below.

In the operations illustrated in FIG. 2A and FIG. 2B, the processing apparatus 200 alternately provides angled ions through a plurality of ion beams 214, and a molecular beam 224, to substrate 112. In some implementations, the controller 226 may switch back and forth multiple times from providing the ion beams 214 to providing the molecular beam 224 in a manner that generates monolayer-by-monolayer conformal growth on a three dimensional feature, such as a substrate feature 142 shown in FIG. 1C.

Figure 2C:
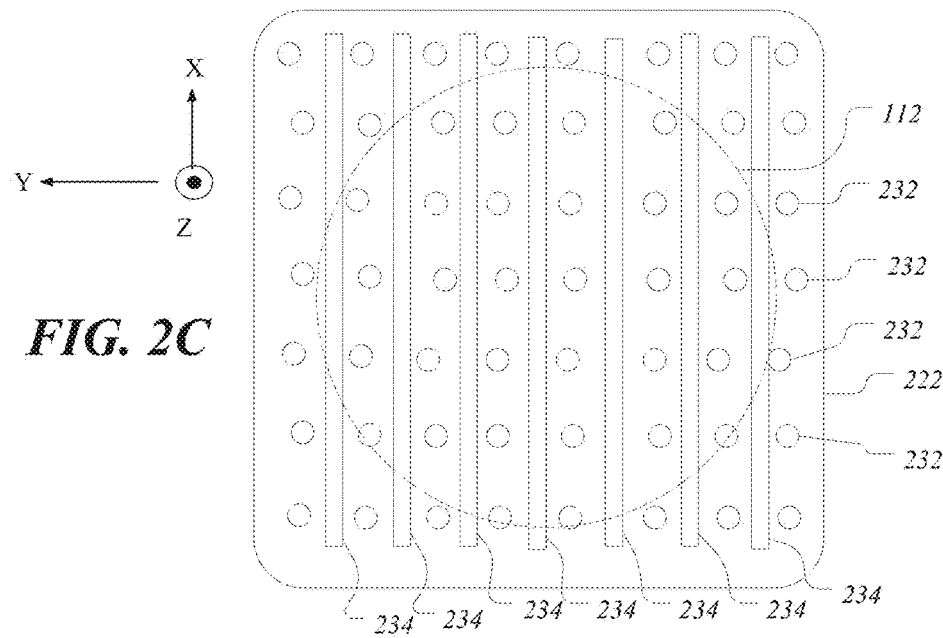
FIG. 2C depicts a plan view of an extraction assembly according to an embodiment of the disclosure.

Turning now to FIG. 2C there is shown a bottom plan view of the extraction assembly 222, which is shown from the perspective of the process chamber 108. As illustrated, the extraction assembly 222 includes a plurality of gas apertures 232 that face the process chamber 108. The gas apertures 232 may be arranged in a two dimensional array as shown. This may be convenient to provide gas beamlets directly above various portions of substrate 112 to provide more uniform flux of gas molecules across the surface of the substrate 112, which may cover the surface 223 of the substrate 112 shown in FIG. 2A. The gas apertures 232 are in communication with the gas inlet 218 such that molecular gas may be transmitted from the gas inlet 218 to the process chamber 108 via the gas channel 206 and gas apertures 232. Although not explicitly shown in FIG. 2C. the extraction assembly 222 may include a plurality of inner channels that extend from respective gas apertures 232 to the gas channel 206. These inner channels may be sealed such that they are not in communication with the plasma chamber 204. Thus, when gas is streamed from the molecular source 118, the gas may be conducted from the molecular source 118 to process chamber 108 without being conducted into the plasma chamber 204.

As further shown in FIG. 2C, the extraction assembly 222 includes a plurality of extraction apertures 234, which may be elongated along the X-direction so that the extraction apertures 234 extend over the entire width of the substrate 112 as shown. The extraction apertures 234 may be arranged in a linear array along the Y-axis as shown so that as a group the extraction apertures 234 cover the entire length of the substrate 112 along the Y-direction as shown. The extraction apertures 234 provide a direct communication between the plasma chamber 204 and the process chamber 108 so that ions stream directly from the plasma 236 to the substrate 112. However, the process chamber 108 may be evacuated to maintain a relatively low pressure, such as below 1 mTorr, or below 10 mTorr, even when the ion beams 214 are directed to the substrate 112, as shown in FIG. 2A. This may also have the effect that ions or other gas species that traverse from the plasma chamber 204 to the process chamber 108 are either captured by surfaces such as the substrate 112 or are evacuated from the process chamber 108 so that these species do not diffuse back into the gas apertures 232.

It is to be noted that depending upon such factors as the number of extraction apertures, the extraction aperture width along the Y direction, and spacing between extraction apertures along the Y-direction, it may be useful to translate the substrate 112 a short distance at least along the Y-direction to provide more uniform exposure to ions. Accordingly, in some embodiments, the substrate holder 110 may be configured to traverse at least along the Y-direction for a short distance, such as a few millimeters or a few centimeters, such as up to 5-10 cm.

In the above-described manner, the extraction assembly may facilitate 222 the provision of a uniform flux of angled ions as well as molecular gas over the entire substrate 112. Moreover, the operation mode may be rapidly switched between providing angled ions and molecular gas so that monolayer-by-monolayer growth of a conformal film may be accomplished in a rapid and efficient manner.

Figure 2D:
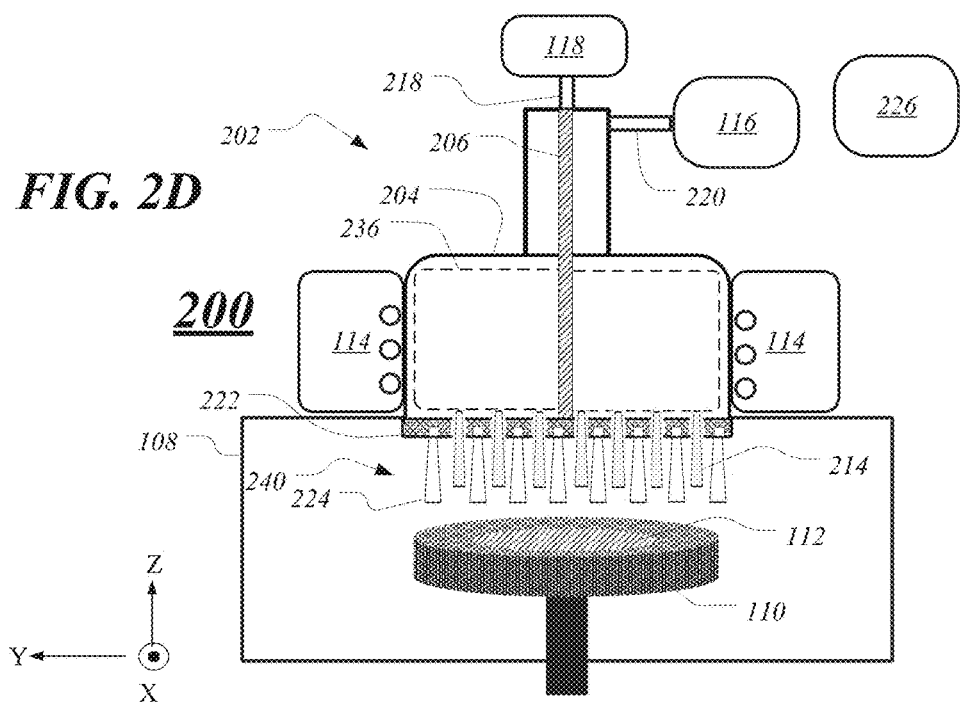
FIG. 2D depicts the processing apparatus of FIG. 2A, shown in a third operation mode.

In various additional embodiments, the processing apparatus may be configured to direct angled ions and a molecular beam simultaneously to a substrate, such as the substrate 112. This implementation is illustrated in FIG. 2D, which depicts the provision of a mixed beam 240 to the substrate 112, where the mixed beam 240 is composed of the molecular beam 224 and energetic beams 214, which may contain ions, radicals, or a combination of ions and radicals Although the aforementioned embodiments depict apparatus in which a gas channel for conducting molecular gas is disposed in a central region of a plasma chamber, in other embodiments, a gas channel or multiple gas channels that conduct gas to an extraction assembly may lie along an edge of a plasma chamber, and may extend into an extraction assembly from one or more peripheral locations on the extraction assembly. The gas channel may also extend horizontally into an extraction assembly within the X-Y plane, for example.

Figure 2E:
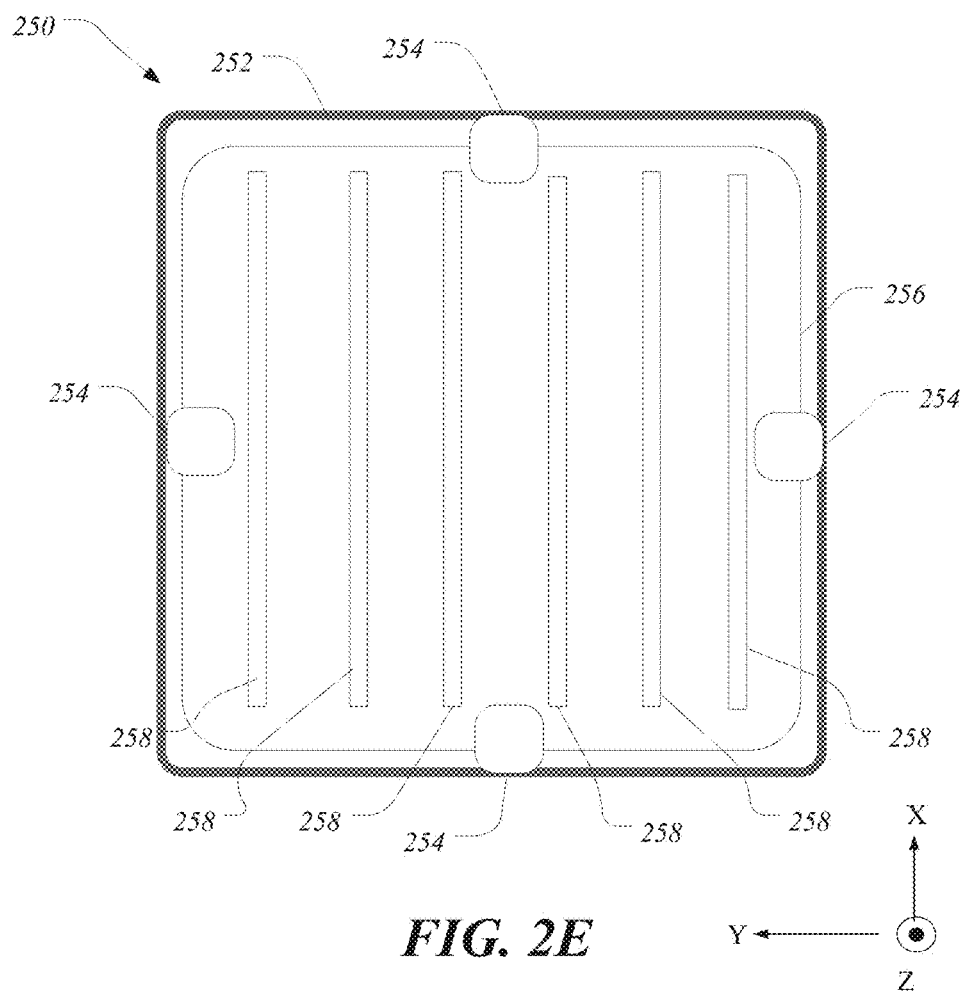
FIG. 2E depicts a top plan view of portion of another processing apparatus according to further embodiments of the disclosure.

FIG. 2E depicts a top plan view of portion of a processing apparatus that includes a hybrid source assembly 250 arranged according to further embodiments of the disclosure. The hybrid source assembly 250 comprises a plasma source chamber 252 and four gas channels shown as gas channels 254 that are arranged along the four walls of the plasma source chamber 252. Also shown is an extraction assembly 256 whose extraction apertures are visible from the plasma chamber 252 as shown. The gas channels 254 may conduct gas to four sides of the extraction assembly 256, which may be equipped with inner channels (not shown) to conduct the gas to multiple gas apertures, which may be arranged as shown in FIG. 2C, for example.

Figure 2F:
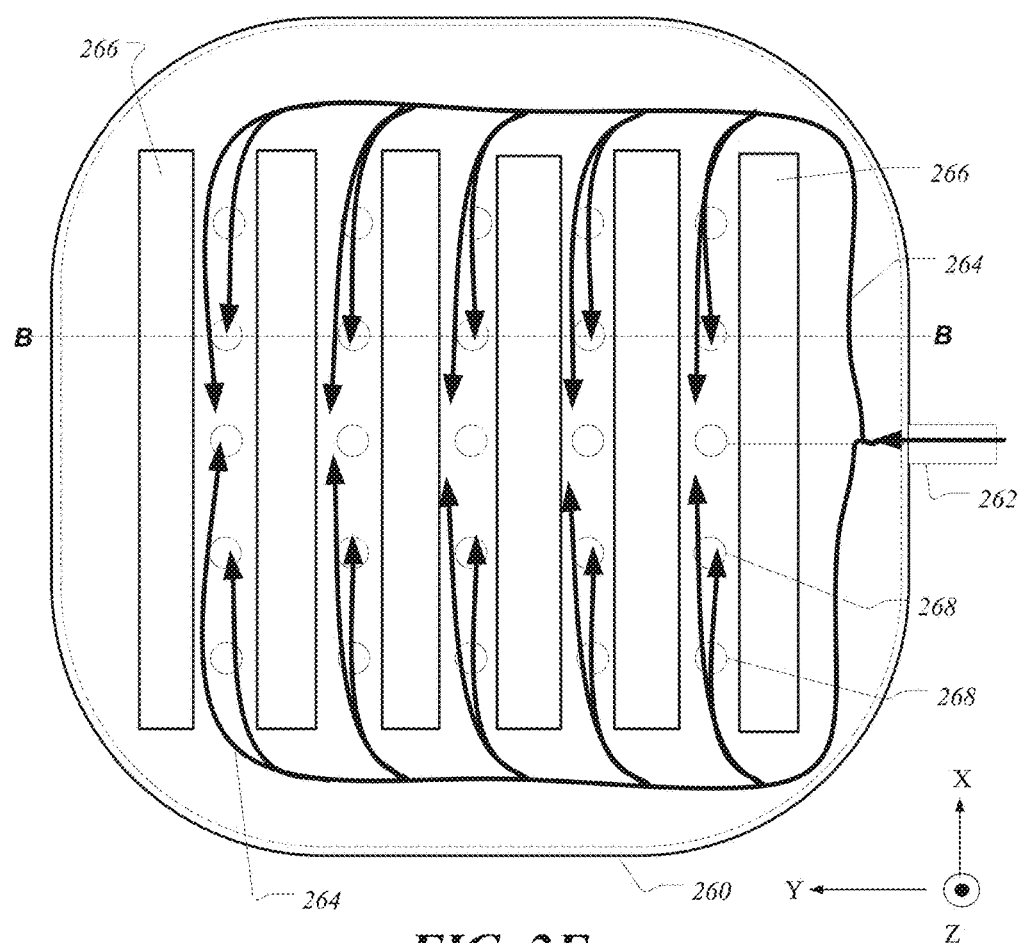
FIG. 2F depicts a bottom plan view of an extraction assembly arranged according to additional embodiments of the disclosure.
Figure 2G:
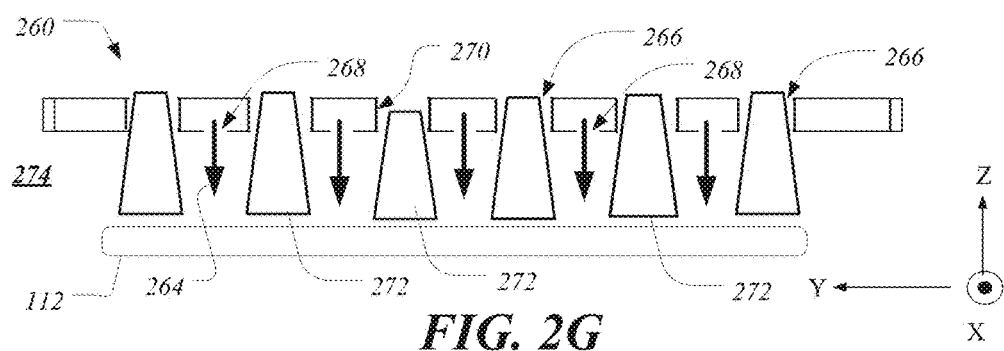
FIG. 2G depicts a side cross-sectional view of the extraction assembly along the line B-B as shown in FIG. 2F.
Figure 2H:
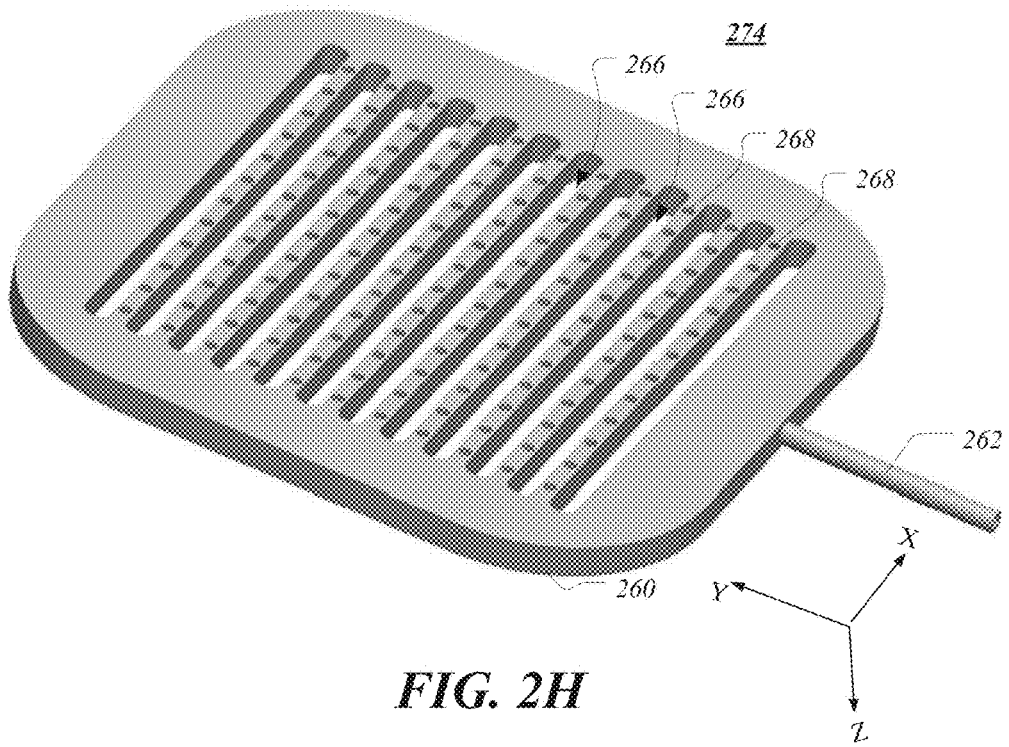
FIG. 2H depicts a perspective bottom view of a variant of the extraction assembly of FIG. 2F.
Figure 2I:
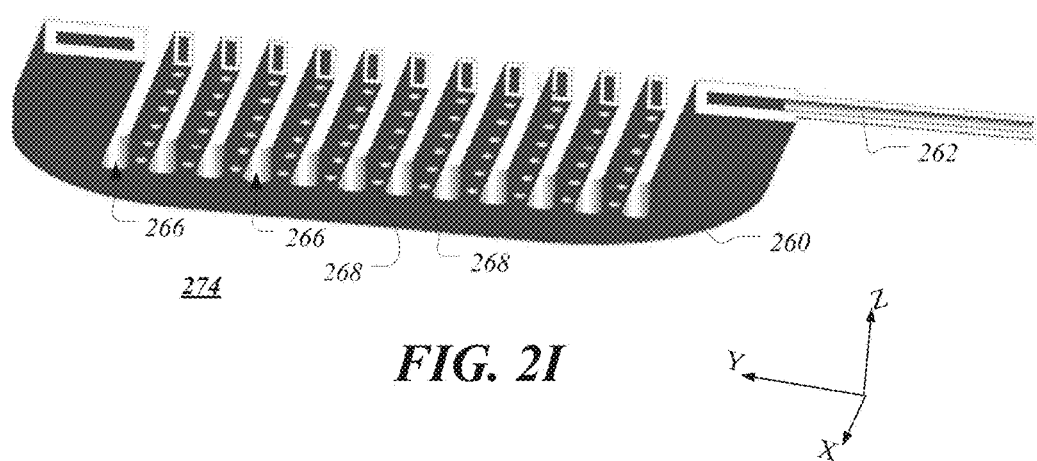
FIG. 2I depicts a cross-sectional perspective view of the extraction assembly of FIG. 2H.

FIG. 2F depicts a bottom plan view of an extraction assembly 260 arranged according to additional embodiments of the disclosure. FIG. 2G depicts a side cross-sectional view of the extraction assembly 260 along the line B-B as shown in FIG. 2F. The perspective of FIG. 2F is as viewed from a plasma chamber 274 shown in FIG. 2G. FIG. 2H depicts a perspective bottom view of a variant of the extraction assembly 260 of FIG. 2F and FIG. 2I depicts a cross-sectional perspective view of the extraction assembly 260 of FIG. 2H. As illustrated the extraction assembly 260 may have a hollow and somewhat cylindrical or pancake shape. A gas channel 262 may conduct molecular gas 264 into the extraction assembly 260 from a side as shown. In some embodiments multiple gas channels may be provided from multiple sides of the extraction assembly 260. However, in other embodiments, a gas channel may be provided from a top or bottom of the extraction assembly 260. For convenience, in FIG. 2F the pattern of flow of molecular gas 264 is superimposed upon the extraction assembly 260, but it will be understood that the molecular gas 264 flows internally within the extraction assembly 260 after entering through the gas channel 262. As illustrated the molecular gas 264 may flow in spaces between extraction apertures 266, which are elongated along the X-axis. The molecular gas 264 may then exit the extraction assembly through the gas apertures 268. The extraction apertures 266 extend through the extraction assembly 260 along the Z-direction, but are isolated from the molecular gas 264 by walls 270 which define the extraction apertures 266.

As further illustrated in FIG. 2G ions may be directed to the substrate as ion beams 272 simultaneously with the molecular gas 264. For clarity, the ion beams 272 are not shown in FIG. 2F, but it may be understood that the ion beams 272 pass through the extraction apertures 266. Moreover, while the molecular gas 262 may overlap spatially with the ion beams 272 within the process chamber 274, in some implementations the pressure in the process chamber 274 may be maintained at a low enough value to prevent molecules of the molecular gas 264 from colliding with ions in the ion beams 272 or other molecules of molecular gas 264 before the molecules reach the substrate 112. Thus, if the substrate 112 is separated along the Z-axis from extraction assembly 260 by 5 cm, the gas pressure may be maintained below 1 mTorr to ensure molecules of the molecular gas reach the substrate without collision, and are therefore in an undissociated state.

Figure 3E:
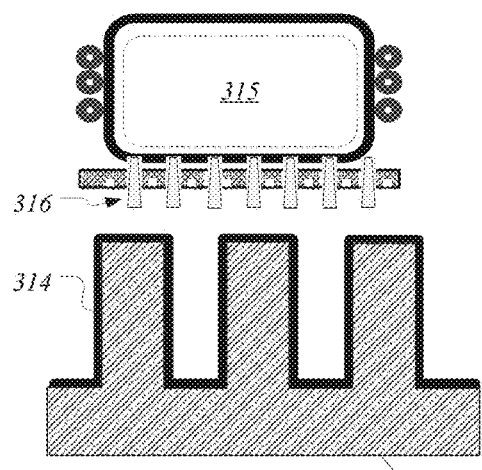

As noted, the hybrid source assembly apparatus of the present embodiments may be employed for rapid synthesis of multiple different conformal layers in a substrate having a three dimensional feature or features. FIG. 3A to FIG. 3H depict an embodiment of the disclosure that details exemplary operations involved in a method for forming a multi-layer stack on three dimensional features using monolayer-by-monolayer growth. In FIG. 3A, a substrate 304 is provided in a process chamber of the processing apparatus 200, which is shown with some components omitted for clarity. The substrate 304 may be a semiconductor wafer having a plurality of substrates features, shown as the features 306. The processing apparatus 200 forms a plasma 301 and directs angled ions 302 to the substrate 304, which may be oxide ions in one embodiment.

Turning now to FIG. 3B, after a given period, the angled ions 302 may form on the substrate features 306 a conformal sub-monolayer. This is shown as sub-monolayer 310, which may comprise oxygen species in some embodiments. After the sub-monolayer 310 is formed, molecular species may be provided to the substrate 304. This is also shown in FIG. 3B in which a molecular beam 308 is directed to the substrate 304 when the sub-monolayer 310 is in place. The molecular beam 308 may contain molecular species configured to react with the species of the sub-monolayer 310 to form a product monolayer. In one example, the molecular beam 308 may be a boron-containing molecule that is configured to react with an oxygen sub-monolayer to form a boron oxide monolayer.

As shown in FIG. 3C, when sufficient molecules of the molecular beam 308 are supplied to the substrate, a monolayer 312 of a product material such as boron oxide, may form. If it is desirable to form a thicker layer of product material than the monolayer 312, the operations of FIG. 3A and FIG. 3B may be repeated at least one additional time, leading to the formation of a layer 314, as shown in FIG. 3D.

Subsequently an additional layer that is different than the product material of layer 314 may be deposited. For instance, continuing with the example in which the layer 314 is a boron oxide layer, it may be desirable to form a sealing layer such as an encapsulating layer on an outer surface of the layer 314, which may be used to assist in doping the substrate 304. In one example, the encapsulating layer may be silicon nitride.

Figure 3F:
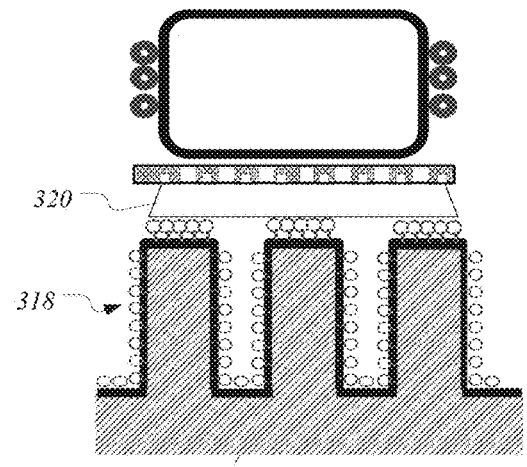

Turning now to FIG. 3E, the processing apparatus 200 forms a plasma 315 and directs angled ions 316 to the substrate 304, which may be nitrogen ions in one embodiment. Turning now to FIG. 3F, after a given period, the angled ions 316 may form on the surface of layer 314 a conformal sub-monolayer. This is shown as sub-monolayer 318, which may comprise nitrogen species in some embodiments. After the sub-monolayer 318 is formed, molecular species may be provided to the substrate 304. This is also shown in FIG. 3F in which a molecular beam 320 is directed to the substrate 304 when the sub-monolayer 318 is in place. The molecular beam 320 may contain molecular species configured to react with the species of the sub-monolayer 318 to form another product monolayer. In one example, the molecular beam 320 may be a silicon-containing molecule such as silane that is configured to react with a nitrogen sub-monolayer to form a silicon nitride monolayer.

Figure 3G:
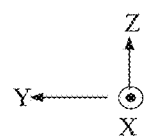
Figure 3G:
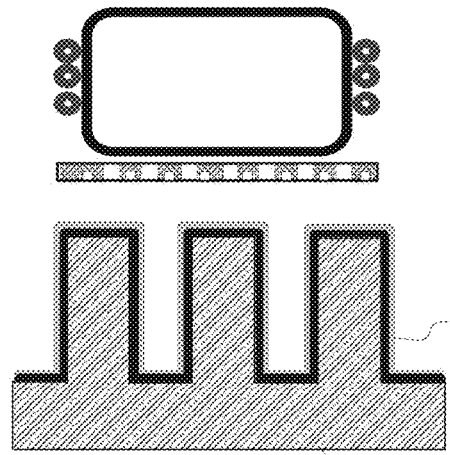
Figure 3H:
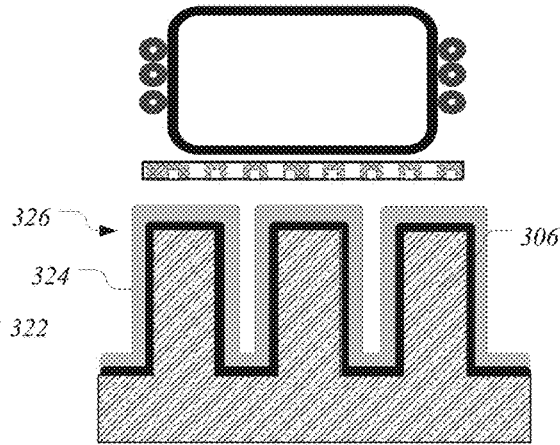

As shown in FIG. 3G, when sufficient molecules of the molecular beam 320 are supplied to the substrate, a monolayer 322 of another product material such as silicon nitride may form. If it is desirable to form a thicker layer of product material than the monolayer 322, the operations of FIG. 3E and FIG. 3F may be repeated at least one additional time, leading to the formation of a layer 324, as shown in FIG. 3H.

In particular embodiments in which molecular layer doping of the substrate 304 is to be performed, the layer stack 326 may be annealed to drive dopants into the substrate features 306, forming a conformal doped region in the substrate features 306.

In the above manner multiple conformal layers may be deposited in a monolayer-by-monolayer process on a substrate having three dimensional features. This may be performed in an efficient and cost effective manner since substrate transfer between positions adjacent different sources is not involved. In addition, purge processing between different sequential operations may be reduced since just the process chamber is shared in common between angled ions and molecular species.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A processing apparatus, comprising:
a process chamber configured to house a substrate;
a hybrid source assembly, comprising:
a gas channel coupled to a molecular source; and
a plasma chamber configured to generate a plasma and isolated from the gas channel, which extends through the plasma chamber; and
an extraction assembly disposed between the hybrid source assembly and process chamber, coupled to the gas channel and plasma chamber, and configured to:
direct an ion beam to the substrate, the ion beam comprising angled ions wherein the angled ions form a non-zero angle with respect to a perpendicular to a substrate plane; and
direct a molecular beam comprising molecular species received from the gas channel to the substrate.

2. The processing apparatus of claim 1, wherein the plasma chamber is disposed around the gas channel, wherein the plasma chamber is configured to form an annular plasma.

3. The processing apparatus of claim 1, wherein the extraction assembly comprises an extraction aperture that generates the ion beam, the extraction aperture configured to modify a shape of a plasma sheath adjacent the extraction aperture, wherein the angled ions exit the plasma sheath at the non-zero angle.

4. The processing apparatus of claim 3, the extraction assembly further comprising at least one additional extraction aperture, wherein the extraction assembly is configured to simultaneously generate a plurality of ion beams that each provides angled ions to the substrate.

5. The processing apparatus of claim 3, the plurality of ion beams configured to cover the substrate without movement of the substrate.

6. The processing apparatus of claim 3, wherein the extraction aperture comprises an elongated extraction aperture.

7. The processing apparatus of claim 1, wherein the extraction assembly comprises a plurality of gas apertures arranged in a two dimensional array, coupled to the gas channel and configured to deliver a plurality of molecular beamlets that form the molecular beam to the substrate.

8. The processing apparatus of claim 7, the plurality of gas apertures being configured to deliver the molecular beam uniformly over the substrate surface of the substrate without movement of the substrate.

9. The processing apparatus of claim 1, further comprising a controller to schedule delivery of the ion beam and molecular beam to the substrate in an alternating fashion to form a monolayer comprising a first sub-monolayer of a first species from the ion beam and a second sub-monolayer of a second species from the molecular beam.

10. The processing apparatus of claim 3, further comprising a pumping apparatus configured to maintain the process chamber at a gas pressure such that the mean free path for gas collisions is less than a separation between the substrate and the extraction assembly when the ion beam and molecular beam are provided to the substrate simultaneously.

11. A processing system, comprising:
a process chamber configured to house a substrate;
a hybrid source assembly, comprising:
a plasma chamber configured to generate a plasma; and
a gas channel extending through the plasma chamber and isolated from the plasma chamber; and
an extraction assembly disposed between the hybrid source assembly and process chamber, coupled to the gas channel and plasma chamber, and configured to:
direct an ion beam to the substrate, the ion beam comprising angled ions wherein the angled ions form a non-zero angle with respect to a perpendicular to a substrate plane; and
direct a molecular beam comprising molecular species received from the gas channel to the substrate.

12. The processing system of claim 11, the extraction assembly comprising a plurality of extraction apertures, wherein the extraction assembly is configured to simultaneously generate a plurality of ion beams that each provides angled ions to the substrate, and wherein the plurality of ion beams is configured to cover an entire substrate surface of the substrate without movement of the substrate.

13. The processing system of claim 11, wherein the extraction assembly comprises a plurality of gas apertures arranged in a two dimensional array, coupled to the gas channel and configured to deliver a plurality of molecular beamlets that form the molecular beam to the substrate.

14. The processing system of claim 11, further comprising a controller to schedule delivery of the ion beam and molecular beam to the substrate in an alternating fashion to form a monolayer comprising a first sub-monolayer of a first species from the ion beam and a second sub-monolayer of a second species from the molecular beam.

15. The processing system of claim 11, further comprising a pumping apparatus configured to maintain the evacuate the process chamber at a pressure below 10 mTorr when the ion beam and molecular beam are provided to the substrate, wherein plasma species from the plasma chamber are prevented from entering the gas channel and molecular species from the gas channel are prevented from entering the plasma chamber.

* * * * *